(12) United States Patent
Ishikawa et al.

(10) Patent No.: US 7,812,594 B2
(45) Date of Patent: Oct. 12, 2010

(54) OPTICAL DEVICE AND METHOD OF CONTROLLING THE SAME

(75) Inventors: Tsutomu Ishikawa, Yamanashi (JP); Toyotoshi Machida, Yamanashi (JP); Hirokazu Tanaka, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 231 days.

(21) Appl. No.: 12/174,948

(22) Filed: Jul. 17, 2008

(65) Prior Publication Data

US 2009/0021238 A1 Jan. 22, 2009

(30) Foreign Application Priority Data

Jul. 19, 2007 (JP) ............................. 2007-188879
Jul. 10, 2008 (JP) ............................. 2008-179731

(51) Int. Cl.
  *G01R 23/02* (2006.01)
(52) U.S. Cl. ............................. 324/95; 324/84; 324/637
(58) Field of Classification Search .............. 324/158.1, 324/84, 95, 637, 750, 500–501, 639; 250/310; 398/79, 82; 359/127
  See application file for complete search history.

(56) References Cited

U.S. PATENT DOCUMENTS

2001/0030786 A1* 10/2001 Takahashi et al. ........... 359/127

2004/0046129 A1* 3/2004 Hosoi et al. .............. 250/484.4

FOREIGN PATENT DOCUMENTS

| EP | 1804349 A1 | 7/2007 |
|----|-----------|--------|
| JP | 8-29813 A | 2/1996 |
| JP | 9-92934 A | 4/1997 |

OTHER PUBLICATIONS

European Search Report dated Nov. 17, 2008, issued in corresponding European Patent Application No. 08104798.7.

* cited by examiner

*Primary Examiner*—Ha Tran T Nguyen
*Assistant Examiner*—Trung Q Nguyen
(74) *Attorney, Agent, or Firm*—Westerman, Hattori, Daniels & Adrian, LLP

(57) ABSTRACT

An optical device includes an optical element, a detector and a controller. The optical element has an optical waveguide. Refractive index of the optical waveguide is controlled by a heater. A temperature of the optical element is controlled by a temperature control device. The detector detects a current flowing in the heater and/or a voltage applied to the heater. The controller controls an electrical power provided to the heater so as to be kept constant according to the detection result of the detector.

18 Claims, 7 Drawing Sheets

FIG. 2

| Ch | INITIAL SETTING VALUE | | | | TARGET VALUE FOR FEEDBACK CONTROL | | | ALARM SETTING RANGE | |
|---|---|---|---|---|---|---|---|---|---|
| | $I_{LD}$[mA] | $I_{SOA}$[mA] | $I_{Heater}$ [mA] | $T_{LD}$ [deg. C] | Im1 [mA] | Im3/Im2 | $P_{Heater}$ [mW] | $R_{Heater}$(MIN) [Ohm] | $R_{Heater}$(MAX) [Ohm] |
| 1 | 100 | 51.0 | 31.8 | 21.23 | 2.23 | 1.50 | 104.18 | 92.7 | 113.3 |
| 2 | 100 | 49.0 | 32.1 | 30.52 | 2.70 | 1.23 | 106.20 | 92.8 | 113.4 |
| 3 | 100 | 48.5 | 34.2 | 32.54 | 1.85 | 1.45 | 121.47 | 93.5 | 114.2 |
| ⋮ | ⋮ | ⋮ | ⋮ | ⋮ | ⋮ | ⋮ | ⋮ | ⋮ | ⋮ |
| n | 100 | 50.0 | 32.2 | 33.33 | 2.14 | 1.41 | 106.95 | 92.8 | 113.5 | ion or gain by tuning refractive index of an optical functional region such as a diffractive grating provided in an optical waveguide in a resonator, as a method of selecting wavelength.

OPTICAL DEVICE AND METHOD OF CONTROLLING THE SAME

BACKGROUND OF THE INVENTION

1. Field of the Invention

The present invention relates an optical device and a method of controlling the optical device.

2. Description of the Related Art

A wavelength tunable semiconductor laser is one of optical devices. The wavelength tunable semiconductor laser has a gain for a laser oscillation and selects wavelength. There is a method of tuning wavelength characteristics of loss, reflection or gain by tuning refractive index of an optical functional region such as a diffractive grating provided in an optical waveguide in a resonator, as a method of selecting wavelength.

The method of tuning the refractive index does not need a mechanical movable portion, being different from a method of tuning a mechanical angle or a mechanical length. Therefore, the method has an advantage in reliability and a manufacturing cost. There is a method of tuning a temperature of an optical waveguide, a method of tuning a carrier density in an optical waveguide with current injection or the like, as a method of tuning refractive index of an optical waveguide. There is proposed a semiconductor laser having a Sampled Grating Distributed Bragg Reflector (SG-DBR) in which peak wavelength of reflection peak ranges periodically and a Sampled Grating Distributed Feedback (SG-DFB) in which peak wavelength of gain spectrum ranges periodically, as a concrete example of a wavelength tunable laser adopting a method of tuning a temperature of an optical waveguide.

This semiconductor laser controls a correlation between the reflection spectrums of the SG-DBR and the SG-DFB, selects a wavelength with a vernier effect, and emits a laser light. That is, the semiconductor laser oscillates at one of wavelengths where two spectrums are overlapped and reflection intensity gets biggest. It is therefore possible to control the oscillation wavelength by controlling the correlation of two reflection spectrums.

Japanese Patent Application Publication No. 9-92934 (hereinafter referred to as Document 1) discloses a semiconductor laser controlling an oscillation wavelength with a control of refractive index of an optical waveguide. In Document 1, a heater is adopted as a control portion of the refractive index of the optical waveguide. The wavelength is controlled with a control of a temperature control of the optical waveguide with use of the heater.

Degradation of the heater is a problem, in a case where the heater is used for a control of the refractive index of the optical waveguide. Heat value of the heater changes even if a constant current is provided to the heater, when a resistance of the heater changes because of the degradation of the heater. In particular, temperature differential between each optical waveguide is important and the unexpected changing of the heat value is fatal, in an optical device that has a combination of the optical waveguides having different wavelength property from each other such as a combination of the SG-DFB and the SG-DBR.

The width of temperature range (ΔT) of the heater for controlling the temperature of the optical waveguide is approximately 40 degrees. The temperature of the heater is relatively low. Therefore, the degradation of the heater has not been considered.

There is a method of controlling heat value of a heater according to a detection result of a temperature detection element such as a thermistor arranged around an optical waveguide. The detection result of the temperature detection element is ideal because the detection result includes a changing of the temperature caused by temperature changing of outer circumstance and the degradation of the heater.

However, it is necessary to arrange the temperature detection element around the heater in order to realize the method. In this case, it is relatively difficult to apply a temperature detection element to a micro device such as a laser chip.

SUMMARY OF THE INVENTION

The present invention has been made in view of the above circumstances and provides an optical device that obtains a desired optical property even if a heater is degraded and a method of controlling the optical device.

According to an aspect of the present invention, there is provided an optical device including an optical element, a detector and a controller. The optical element has an optical waveguide. Refractive index of the optical waveguide is controlled by a heater. A temperature of the optical element is controlled by a temperature control device. The detector detects a current flowing in the heater and/or a voltage applied to the heater. The controller controls an electrical power provided to the heater so as to be kept constant according to the detection result of the detector.

With the structure, the temperature changing of the optical device is restrained with use of the temperature control device. That is, the temperature of the optical waveguide is substantially determined by the heat value of the heater, because the temperature changing of the optical device caused by outer environmental changing may be neglect. On the other hand, the heat value of the heater is determined by the electrical power provided to the heater. In this case, the heat value is stabilized when the amount of the electrical power of the heater is controlled to be kept constant. The present invention controls the temperature of the optical element with use of the temperature control device in order to substantially determine the temperature of the optical waveguide in view of the above circumstances. And, the current flowing in the heater and/or the voltage applied to the heater is detected in order to determine the amount of the electrical power of the heater. According to the present invention, the amount of the electrical power of the heater is determined and the heater is controlled with the amount of electrical power. Therefore, the heat value may be kept constant even if the heater is degraded. And a desirable optical property may be obtained.

According to another aspect of the present invention, there is provided a method of controlling an optical device including: controlling a temperature of an optical semiconductor element with a temperature control device; controlling refractive index of the optical semiconductor device with a heater; and controlling an electrical power provided to the heater so as to be kept constant according to a current flowing in the heater and/or a voltage applied to the heater.

With the method, the temperature changing of the optical semiconductor element is restrained with use of the temperature control device. Further, the heat value of the heater may be stabilized, because the electrical power provided to the heater is controlled to be kept constant. In this case, desired optical property may be obtained even if the heater is degraded.

BRIEF DESCRIPTION OF THE DRAWINGS

Other objects, features and advantages of the present invention will become more apparent from the following detailed description when read in conjunction with the accompanying drawings, in which:

FIG. 2 illustrates an example of a look-up table;

DESCRIPTION OF THE PREFERRED EMBODIMENTS

A description will now be given of embodiments of the present invention with reference to the accompanying drawings.

First Embodiment

Figure 1:
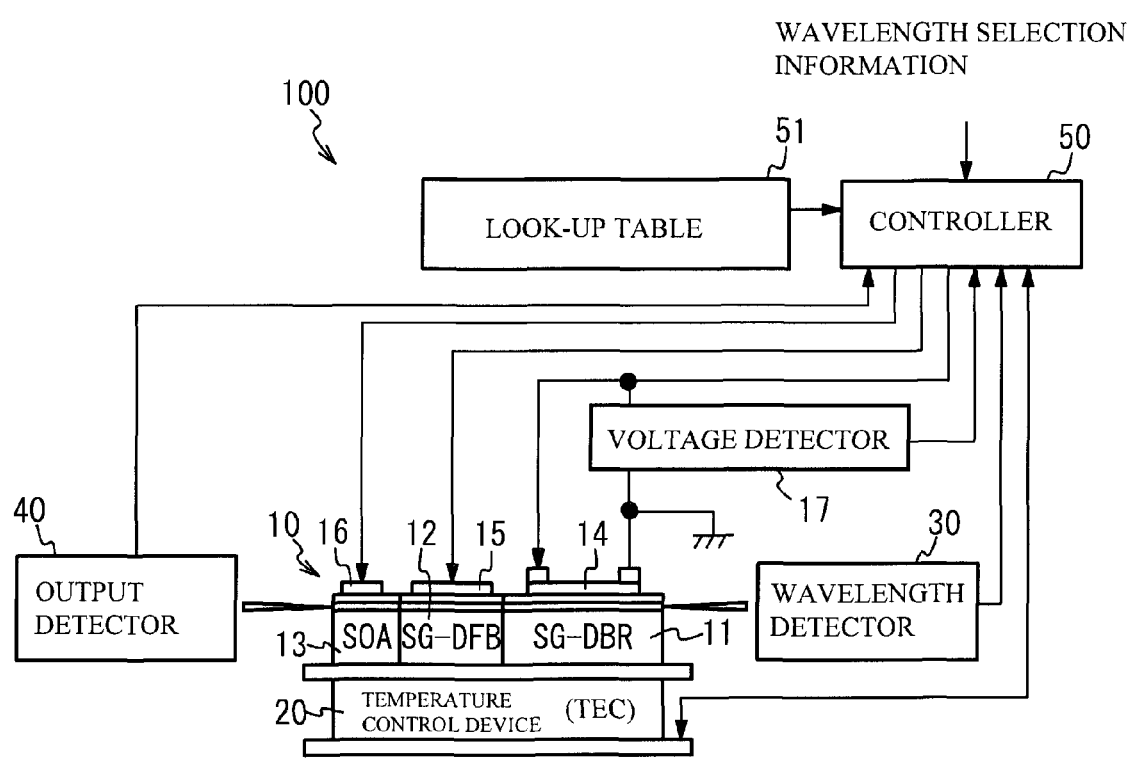
FIG. 1 illustrates a semiconductor laser in accordance with a first embodiment and a structure of a laser device having the semiconductor laser.

A description will be given of a semiconductor laser as an optical element. FIG. 1 illustrates a semiconductor laser 10 in accordance with a first embodiment and a structure of a laser device 100 having the semiconductor laser 10. As shown in FIG. 1, the laser device 100 has the semiconductor laser 10, a temperature control device 20, a wavelength detector 30, an output detector 40 and a controller 50. The semiconductor laser 10 is mounted on the temperature control device 20. A description will be given of each part.

The semiconductor laser 10 has a structure in which a SG-DBR region 11, a SG-DFB region 12 and a semiconductor amplifier (SOA: Semiconductor Optical Amplifier) region 13 are coupled in order. The SG-DBR region 11 has an optical waveguide in which gratings are provided at a given interval. That is, the optical waveguide of the SG-DBR region 11 has a first region that has a diffractive grating and a second region that is optically connected to the first region and acts as a spacer. The optical waveguide of the SG-DBR region 11 is composed of semiconductor crystal having an absorption edge wavelength at shorter wavelengths side compared to a laser oscillation wavelength. A heater 14 is provided on the SG-DBR region 11.

The SG-DFB region 12 has an optical waveguide in which gratings are provided at a given interval. That is, the optical waveguide of the SG-DFB region 12 has a first region that has a grating and a second region that is optically connected to the first region and acts as a spacer. The optical waveguide of the SG-DFB region 12 is composed of a semiconductor crystal amplifying a light of a desirable wavelength of a laser oscillation. An electrode 15 is provided on the SG-DFB region 12. The SOA region 13 is composed of semiconductor crystal for amplifying a light or for absorbing a light with a current control. An electrode 16 is provided on the SOA region 13. The optical waveguides of the SG-DBR region 11, the SG-DFB region 12 and the SOA region 13 are optically connected to each other. The laser device 100 has a voltage detector 17 detecting a voltage applied to the heater 14.

The semiconductor laser 10 and the thermistor (not shown) are mounted on the temperature control device 20. The wavelength detector 30 has a light receiving element for detecting an intensity of a lasing light and a light receiving element for detecting an intensity of a lasing light that transmits an etalon and has wavelength property. The output detector 40 has a light receiving element for detecting an intensity of a lasing light passing through the SOA region 13. In FIG. 1, the wavelength detector 30 is arranged on the side of the SG-DBR region 11, and the output detector 40 is arranged on the side of the SOA region 13. However, the structure of the laser device 100 is not limited. For example, each of the detectors may be arranged in reverse.

The controller 50 has a control portion having a central processing unit (CPU), a random access memory (RAM), a read only memory (ROM) and so on and a electrical power supply. The ROM of the controller 50 stores control information and a control program of the semiconductor laser 10. The control information is, for example, stored in a look-up table 51. FIG. 2 illustrates an example of the look-up table 51.

As shown in FIG. 2, the look-up table 51 includes an initial setting value, a target value for feedback control, and an alarm setting range in every channel. The initial setting value includes an initial current value $I_{LD}$ of the SG-DFB region 12, an initial current value $I_{SOA}$ of the SOA region 13, an initial current value $I_{Heater}$ of the heater 14 and the initial temperature value $T_{LD}$ of the temperature control device 20. The target value for the feedback control includes a target value Im1 for feedback control of the output detector 40, a target value Im3/Im2 for feedback control of the wavelength detector 30 and a target electrical power value $P_{Heater}$ for feedback control of the heater 14. The alarm setting range includes a resistance $R_{heater}$(minimum) that is a minimum resistance of the heater 14 and a maximum resistance $R_{Heater}$(maximum) of the heater 14.

Figure 3:
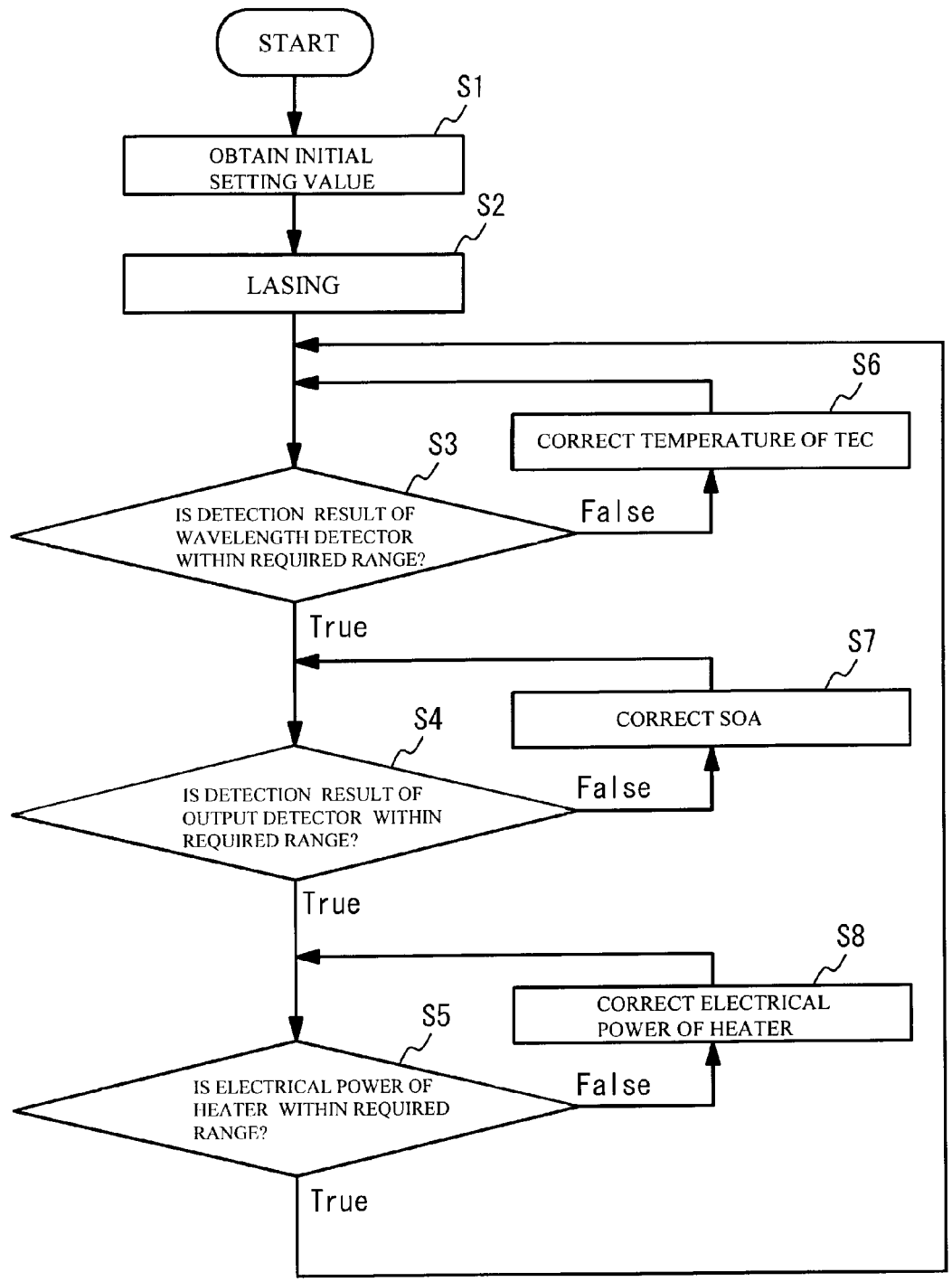
FIG. 3 illustrates a flowchart showing an example of a controlling method of the laser device.

Next, a description will be given of a controlling method of the laser device 100. FIG. 3 illustrates a flowchart showing a controlling method of the laser device 100. As shown in FIG. 3, the controller 50 refers to the look-up table 51 and obtains the initial current value $I_{LD}$, the initial current value $I_{SOA}$, the initial current value $I_{Heater}$ and the initial temperature value $T_{LD}$ (Step S1).

Next, the controller 50 starts a laser oscillation of the semiconductor laser 10 according to the initial setting value obtained in the Step S1 (Step S2). In concrete, the controller 50 controls the temperature control device 20 so that the temperature of the temperature control device 20 is controlled to be the initial temperature value $T_{LD}$. And the temperature of the semiconductor laser 10 is controlled to be constant near the initial temperature value $T_{LD}$. Consequently the equivalent refractive index of the optical waveguide of the SG-DFB region 12 is controlled to be a given value. Next, the controller 50 provides a current of the initial current value $I_{Heater}$ to the heater 14. Therefore, the equivalent refractive index of the optical waveguide of the SG-DBR region 11 is controlled to be a given value. Next, the controller 50 provides a current of the initial current value $I_{LD}$ to the electrode 15. And a light is generated in the optical waveguide of the SG-DFB region 12. The light generated in the SG-DFB region 12 is repeatedly reflected and amplified in the optical waveguide of the SG-DBR region 11 and the SG-DFB region 12. This results in a laser oscillation. Then, the controller 50 provides a current of the initial current value $I_{SOA}$ to the electrode 16. With these sequences, the semiconductor laser 10 emits a lasing light at an initial wavelength corresponding to a set channel.

Then, the controller 50 determines whether the wavelength of the lasing light is within a required range according to the detection result of the wavelength detector 30 (Step S3). In concrete, the controller 50 obtains the target value Im3/Im2 for feedback control from the look-up table 51, obtains a ratio Im3/Im2 of the two light receiving elements in the wavelength detector 30 and determines whether the ratio Im3/Im2 is within a given range including the target value Im3/Im2 for feedback control.

If it is not determined that the wavelength of the lasing light is within the required range in the Step S3, the controller 50 corrects the temperature of the temperature control device 20 (Step S6). In this case, peak wavelength of a gain spectrum in the optical waveguide in the SG-DFB region 12 changes. After that, the controller 50 executes the Step S3 again. With the loop, the wavelength of the lasing light is feedback controlled to be kept a desired constant value.

If it is determined that the wavelength of the lasing light is within the required range in the Step S3, the controller 50 determines whether the optical intensity of the lasing light is within a required range (Step S4). In concrete, the controller 50 obtains the target value Im1 for feedback control from the look-up table 51, obtains the detection result Im1 of the light receiving element in the output detector 40, and determines whether the detection result Im1 is within a given range including the target value Im1 for feedback control.

If it is not determined that the optical intensity of the lasing light is within the required range in the Step S4, the controller 50 corrects the current provided to the electrode 16 (Step S7). After that, the controller 50 executes the Step S4 again. With the loop, the optical intensity of the lasing light is feedback controlled to be a desired constant value.

If it is determined that the optical intensity of the lasing light is within the required range in the Step S4, the controller 50 determines whether the electrical power provided to the heater 14 is within a required range (Step S5). In concrete, the controller 50 obtains the target value $P_{Heater}$ for feedback control from the look-up table 51, and calculates the electrical power provided to the heater 14 with the detection result of the voltage detector 17 and the current value provided to the heater 14. The controller 50 determines whether the calculated value is within a required range including the target value $P_{Heater}$ for feedback control.

If it is not determined that the electrical power provided to the heater 14 is within the required range in the Step S5, the controller 50 corrects the electrical power provided to the heater 14 (Step S8). In this case, the electrical power may be corrected when at least one of the current and the voltage is corrected. In the embodiment, the controller 50 corrects the electrical power by increasing and decreasing the current value provided to the heater 14. With the loop, the electrical power provided to the heater 14 is feedback controlled so that the electrical power provided to the heater 14 is controlled to be kept a desired constant value. If it is determined that the electrical power provided to the heater 14 is within the required range in the Step S5, the controller 50 executes the Step S3 again.

In the embodiment, the temperature change of the semiconductor laser 10 is restrained with use of the temperature control device 20. Further, heat value of the heater 14 is stabilized even if the resistance of the heater 14 is changed because of degradation thereof, because the electrical power provided to the heater 14 is controlled to be kept constant. In this case, a temperature differential between the SG-DBR region 11 and the SG-DFB region 12 is kept constant. Therefore, the semiconductor laser 10 oscillates at a desired wavelength even if the heater 14 is degraded.

In the embodiment, it is possible to control the temperature of the optical waveguide without a temperature detection element on the semiconductor laser 10.

In the embodiment, the voltage detector 17 detects the voltage applied to the heater 14. And the current provided to the heater 14 is controlled to be a given value. It is therefore possible to monitor the resistance changing of the heater 14 with the voltage value and the current value. In this case, it is possible to determine a breaking of the heater 14 and a possibility of the breaking. For example, the controller 50 may warn a user of the breaking in a case where the electrical resistance obtained from the detection result of the voltage detector 17 is over the resistance $R_{Heater}$ (maximum). In this case, it is possible to urge a user to exchange of the semiconductor laser 10.

The alert of the breaking is effective to both time degradation of the heater 14 and a sudden environment changing. In particular, there is a case where the heater is subjected to an unexpected stress because of a production tolerance, usage environment or the like, because a heater is provided on a micro area of a tunable laser such as the semiconductor laser 10. In this case, there may be a case where the heater is degraded in an unexpected period shorter than an expected lifetime. The above-mentioned alert of the breaking is effective as a measure against the case. And the controller 50 may warn a user when the electrical resistance of the heater 14 is under the resistance $R_{Heater}$ (minimum). In this case, it is restrained that an excessive current is provided to the heater 14.

Figure 4:
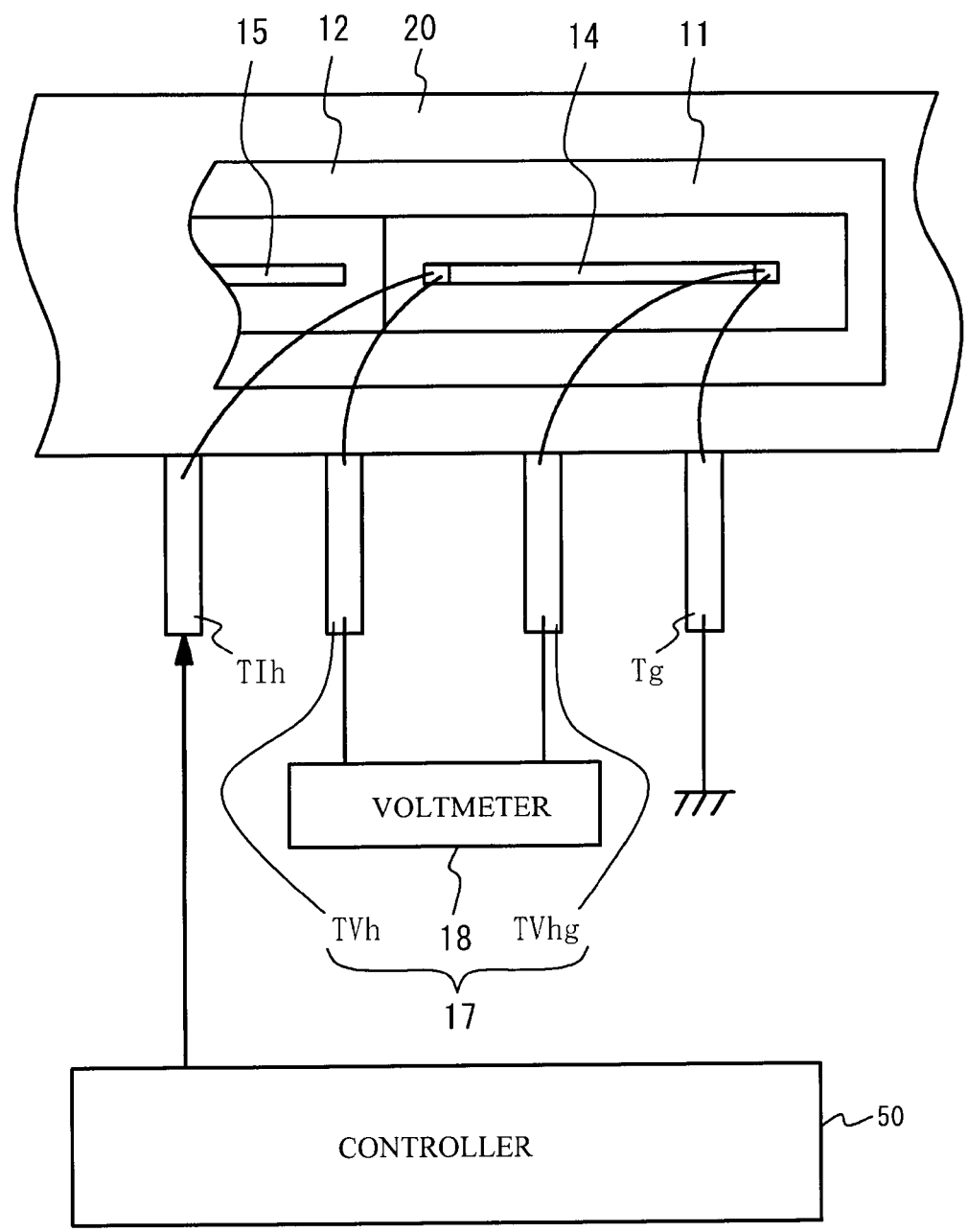
FIG. 4 illustrates details of a voltage detector.

A description will be given of an example of the voltage detector 17. FIG. 4 illustrates details of the voltage detector 17. As shown in FIG. 4, the voltage detector 17 includes a voltmeter 18, a terminal TVh and a terminal TVhg. The terminal TVh is connected to a first end of the heater 14. The terminal TVhg is connected to the second end of the heater 14. A driving current from the controller 50 is provided to the first end of the heater 14 from a terminal TIh, and is grounded through a terminal TIg from the second end of the heater 14.

With the structure, the heater driving current does not flow between the terminal TVh and the terminal TVhg. In this case, it is restrained that a voltage drop caused by a resistance of such as a terminal or a wire affects the detection result of the voltmeter 18. It is therefore possible to detect the voltage applied to the heater 14 accurately.

In the embodiment, the semiconductor laser has a combination of the SG-DBR region and the SG-DFB region. However, the structure is not limited. For example, the present invention may be applied to a semiconductor laser in which an active region acting as a gain region is between a pair of SG-DBR regions. In this case, a heater is provided on each of the SG-DBR regions or one of the SG-DBR regions. In this case, it is possible to control in feedback so that the electrical power provided to the heater is kept constant, if the voltage applied to the heater is detected by the voltage detector 17.

The present invention may be applied to a CSG-DBR (Chirped Sampled Grating Distributed Bragg Reflector). In the CSG-DBR, space regions connecting gratings have a different length from each other, being different from the SG-DBR region. Therefore, there is wavelength dependence in a peak intensity of a reflection spectrum of the CSG-DBR region. In this case, the peak intensity of the reflection spectrum is enlarged in a given wavelength range. It is therefore possible to restrain an oscillation at a wavelength other than a desired wavelength, if a wavelength in a wavelength range having relatively high intensity is used as a lasing wavelength.

In the embodiment, the semiconductor laser 10 corresponds to the optical element, the voltage detector 17 corresponds to the detector, the SG-DFB region 12 corresponds to the active region, and the SG-DBR region 11 corresponds to the optical waveguide.

Second Embodiment

Figure 5:
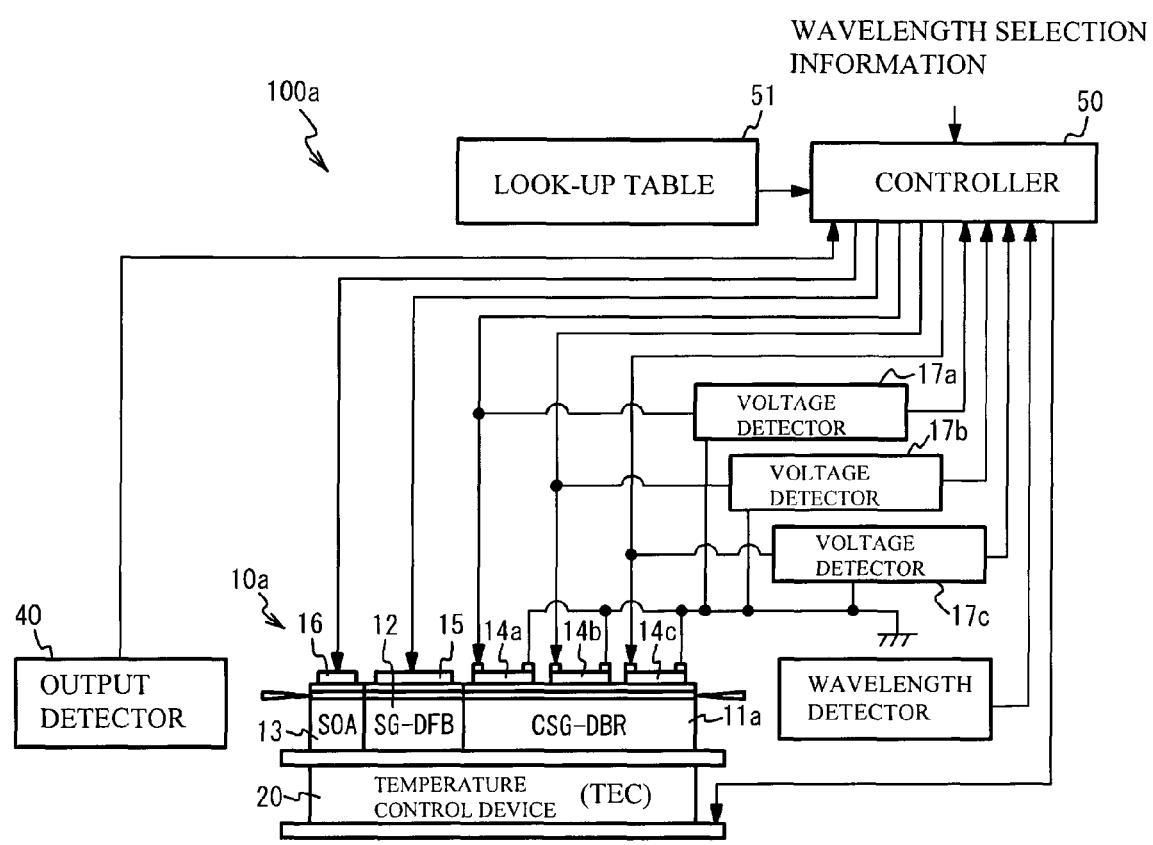
FIG. 5 illustrates a semiconductor laser in accordance with a second embodiment and a structure of a laser device having the semiconductor laser.

In a second embodiment, a description will be given of a semiconductor laser having the above-mentioned CSG-DBR. FIG. 5 illustrates a semiconductor laser 10a and a structure of a laser device 100a having the semiconductor laser 10a. As shown in FIG. 5, the semiconductor laser 10a has a CSG-DBR region 11a instead of the SG-DBR region 11. In the embodiment, the CSG-DBR region 11a has three segments having a combination of a grating and a spacer region. Accordingly, three heaters 14a, 14b and 14c are provided on the CSG-DBR region 11a according to each of the segments. And voltage detectors 17a, 17b and 17c are provided according to each of the heaters.

In the embodiment, it is possible to keep the heat value of each heater constant when the electrical power provided to each of the heaters is feedback controlled to be kept constant according to the detection result of each of the voltage detector. Therefore, the semiconductor laser 10a obtains a desired oscillation wavelength.

The number of the grating and the number of the heater are not limited in the CSG-DBR region.

Third Embodiment

The present invention may be applied to an optical element other than a semiconductor laser. For example, the present invention may be applied to a mach-Zehnder optical switch. This optical switch is used in an exchange system such as an optical cross connect.

Figure 6:
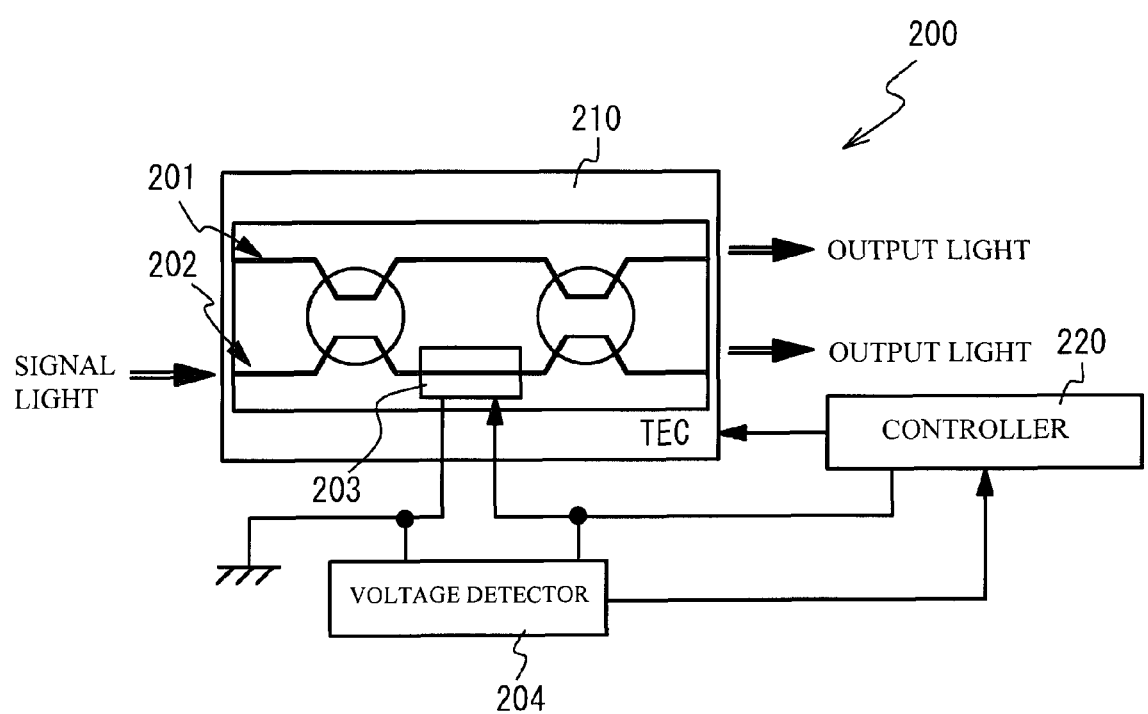
FIG. 6 illustrates a structure of an optical switch in accordance with a third embodiment.

FIG. 6 illustrates a structure of an optical switch 200 in accordance with a third embodiment. As shown in FIG. 6, the optical switch 200 is made of a material having a thermooptical effect such as silica-based material. The optical switch 200 has a mach-Zehnder interference structure having a first waveguide 201 and a second waveguide 202. The optical switch 200 is arranged on a temperature control device 210. Therefore, the temperature control device 210 controls temperature of each part thereof.

The optical switch 200 has a heater 203. The heater 203 heats the second waveguide 202. This results in a changing of a phase differential between a light transmitting in the first waveguide 201 and a light transmitting in the second waveguide 202. And the optical switch 200 selects a cross condition or a bar condition of the optical signal of the first waveguide 201 and the second waveguide 202. Further, the heater 203 is connected to a voltage detector 204. The voltage detector 204 detects a voltage applied to the heater 203, and gives the detection result to a controller 220.

In the embodiment, the controller 220 controls the temperature control device 210 so that the temperature of the optical switch 200 is kept at a given temperature. And the controller 220 controls an electrical power provided to the heater 203 in feedback so as to be kept constant, according to the detection result of the voltage detector 204. In this case, the heat value of the heater 203 is kept constant even if the heater 203 is degraded. Therefore, the phase differential between the light transmitting in the first waveguide 201 and the light transmitting in the second waveguide 202 is kept constant. Consequently, switching reliability of the optical switch 200 gets higher.

In the embodiment, the optical switch 200 corresponds to the optical element, the voltage detector 204 corresponds to the detector, and the optical switch 200, the voltage detector 204 and the controller 220 correspond to the optical device.

Figure 7:
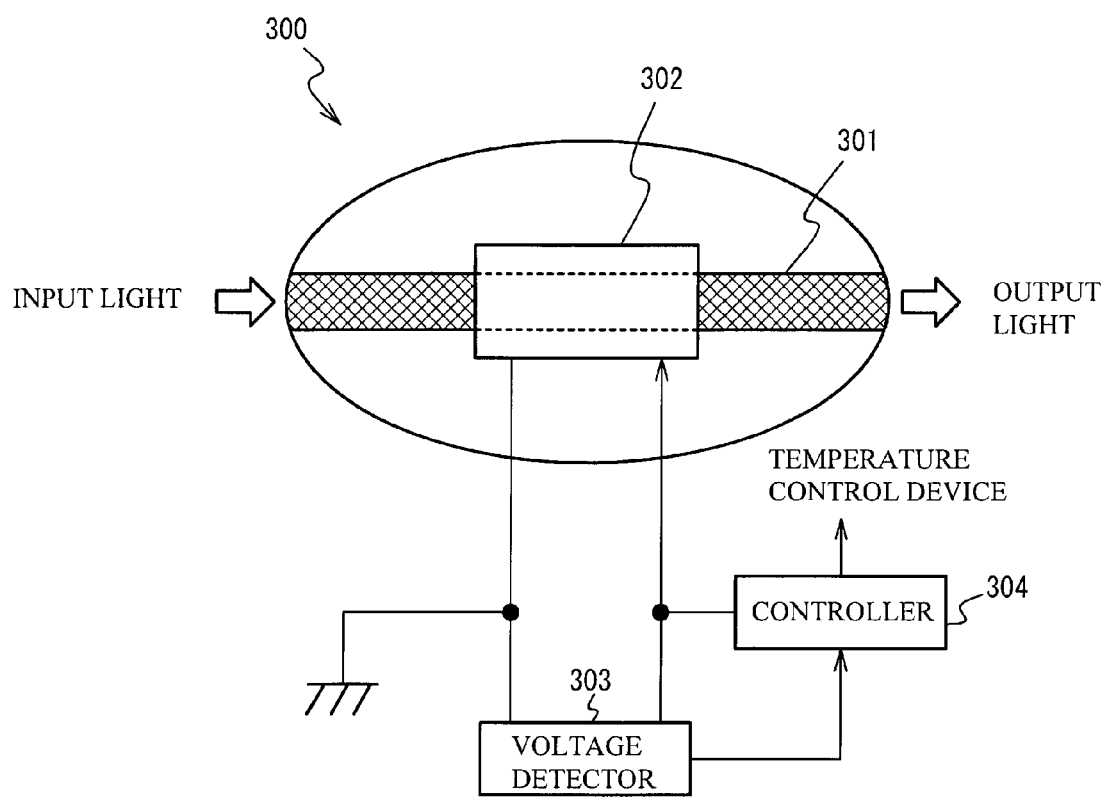
FIG. 7 illustrates a top view of a main part of an optical waveguide in accordance with a fourth embodiment.

The present invention may be applied to an optical waveguide where a heater may control a phase of a light passing therethrough. FIG. 7 illustrates a top view of a main part of an optical waveguide 300 in accordance with a fourth embodiment. As shown in FIG. 7, the optical waveguide 300 has a buried hetero-structure. A heater 302 is provided on an optical waveguide core 301. The optical waveguide core 301 simply transmits a light. Therefore, the optical waveguide core 301 does not have an optical structure such as a diffractive grating. The optical waveguide 300 is arranged on a temperature control device (not shown). The temperature control device controls a temperature of the entire area of the optical waveguide 300.

The optical waveguide core 301 is made of a thermooptical material such as silica-based material or semiconductor material such as GaInAsP or AlGaInAs. A voltage detector 303 is connected to the heater 302. The voltage detector 303 detects a voltage applied to the heater 302 and gives the detected result to a controller 304. The controller 304 controls an amount of an electrical power provided to the heater 302, according to the detected result of the voltage detector 303.

There is a case where an optical length of the optical waveguide core 301 differs from a designed optical length thereof because of a production tolerance. The tolerance causes that a phase of a light signal passing through the optical waveguide core 301 is different from a designed value. This is a big problem for an optical device using a phase of a light signal. In the embodiment, the heater 302 is provided in order to control a phase of a laser light passing through the optical waveguide core 301. In order to absorb the product tolerance, the temperature of the optical waveguide core 301 is controlled with the heating of the heater 302, and the optical length of the optical waveguide core 301 is finely controlled. In this case, the heat value of the heater 302 is stabilized if the electrical power provided to the heater 302 is controlled to be kept constant, even if the heater is degraded. This results in a high accurate control.

The optical waveguide 300 may be applied to a mach-Zehnder optical switch. In this case, an optical length differential between two waveguides may be controlled with a heater.

In the above-mentioned embodiments, a voltmeter detects a voltage applied to a heater. However, the structure is not limited. For example, a current meter may detect a current provided to the heater, and an electrical power may be controlled by controlling the voltage applied to the heater. And an electrical power meter may detect the electrical power provided to the heater and the electrical power may be controlled by controlling a current provided to the heater and/or a voltage applied to the heater.

The present invention is not limited to the specifically disclosed embodiments, but include other embodiments and variations without departing from the scope of the present invention.

The present application is based on Japanese Patent Application Nos. 2007-188879 filed on Jul. 19, 2007 and 2008-179731 filed on Jul. 10, 2008, the entire disclosure of which is hereby incorporated by reference.

What is claimed is:

1. An optical device comprising:
an optical element that has an optical waveguide, refractive index of the optical waveguide being controlled by a heater, and a temperature of the optical element being controlled by a temperature control device;

a detector that detects a current flowing in the heater and/or a voltage applied to the heater; and a controller that controls an electrical power provided to the heater so as to be kept constant according to the detection result of the detector.

2. The optical device as claimed in claim 1, wherein the detector detects a voltage at both ends of the heater.

3. The optical device as claimed in claim 2, wherein the controller controls an amount of current provided to the heater, and obtains the electrical power provided to the heater according to a product of the detection result of the voltage at both ends of the heater and the amount of the current provided to the heater.

4. The optical device as claimed in claim 2 further comprising:

a terminal for providing a current to the heater;

a terminal for grounding the heater; and a terminal that is connected to the heater separately from said terminals and is for detecting the voltage applied to the heater with the detector.

5. The optical device as claimed in claim 1, wherein the optical element is a wavelength tunable semiconductor laser.

6. The optical device as claimed in claim 1, wherein the optical element has an active region that has a diffractive grating and an optical waveguide that is optically connected to the active region and has a diffractive grating, equivalent refractive index of the optical waveguide being tunable with the heater.

7. The optical device as claimed in claim 6, wherein the diffractive grating of the active region and the optical waveguide has a first region that has a diffractive grating and a second region that is connected to the first region and acts as a spacer.

8. The optical device as claimed in claim 1, wherein the optical element has an active region and a pair of optical waveguides optically connected to both ends of the active region respectively, at least one of the optical waveguides having the heater for controlling equivalent refractive index thereof.

9. The optical device as claimed in claim 1, wherein the optical element is a mach-Zehnder optical switch having a pair of optical waveguides, refractive index of at least one of the optical waveguides being controlled by the heater.

10. The optical device as claimed in claim 1, wherein the optical waveguide does not have a diffractive grating in a region where the heater is provided.

11. A method of controlling an optical device comprising:

controlling a temperature of an optical semiconductor element with a temperature control device;

controlling refractive index of the optical semiconductor element with a heater; and controlling an electrical power provided to the heater so as to be kept constant according to a current flowing in the heater and/or a voltage applied to the heater.

12. The method as claimed in claim 11, wherein the electrical power is controlled by controlling the current provided to the heater according to the voltage applied to the heater.

13. The method as claimed in claim 11, wherein the optical element is a wavelength tunable semiconductor laser.

14. The method as claimed in claim 11, wherein the optical element has an active region that has a diffractive grating and an optical waveguide that is optically connected to the active region and has a diffractive grating, equivalent refractive index of the optical waveguide being tunable with the heater.

15. The method as claimed in claim 14, wherein the diffractive grating of the active region and the optical waveguide has a first region that has a diffractive grating and a second region that is connected to the first region and acts as a spacer.

16. The method as claimed in claim 11, wherein the optical element has an active region and a pair of optical waveguides optically connected to both ends of the active region respectively, at least one of the optical waveguides having the heater for controlling equivalent refractive thereof.

17. The method as claimed in claim 11, wherein the optical element is a mach-Zehnder optical switch having a pair of optical waveguides, refractive index of at least one of the optical waveguides being controlled by the heater.

18. The method as claimed in claim 11 further comprising controlling the refractive index of the optical waveguide with the heater so that an optical length of the optical waveguide different from a designed optical length thereof is controlled to be the designed optical length.

* * * * *